United States Patent [19]

Holm et al.

[11] Patent Number: 5,032,737
[45] Date of Patent: Jul. 16, 1991

[54] IGNITION CIRCUIT MODULE AND METHOD OF MANUFACTURE

[75] Inventors: David R. Holm, Oconomowoc; Rudolph A. Peterson, Jr., Horicon, both of Wis.

[73] Assignee: Deere & Company, Moline, Ill.

[21] Appl. No.: 557,887

[22] Filed: Jul. 24, 1990

[51] Int. Cl.$^5$ .......................... B60L 1/00; H02G 3/00; H05K 3/34; H05K 7/14
[52] U.S. Cl. .................................... 307/9.1; 361/412; 174/254; 29/840; 29/850
[58] Field of Search ...................... 307/9.1, 10.3, 10.6; 439/34; 180/90; 361/397–400, 412, 413; 200/11 D, 11 DA, 11 G, 11 J; 174/254, 260; 29/832, 840, 850

[56] References Cited

U.S. PATENT DOCUMENTS

| | | | |
|---|---|---|---|
| 3,651,288 | 3/1972 | Cryer | 200/44 |
| 4,399,888 | 8/1983 | Contato | 180/315 |
| 4,715,822 | 12/1987 | Stribel | 439/74 |
| 4,723,196 | 2/1988 | Hofmeister et al. | 361/399 |
| 4,769,741 | 9/1988 | Smith | 361/395 |
| 4,943,238 | 7/1990 | Gregorio | 434/224 |

Primary Examiner—Todd E. DeBoer
Assistant Examiner—Richard T. Elms

[57] ABSTRACT

The ignition switch for a vehicle such as a lawn and garden tractor is connected directly to a printed circuit board which also includes interlock systems components. The circuit board with the switch and other components is wave soldered in an automated process to make good electrical connections for reduced voltage drops, thereby reducing the number of relays required. Wiring harnesses are also soldered directly to the board during the soldering step. In the preferred embodiment, the ignition switch is fixed to the board and supports the board from the console of the vehicle. However, if the switch or another component on the circuit board needs to be remotely located with respect to the remainder of the board, the switch or component is mounted on a break-away section of the board, and the wires connecting the board sections are soldered with the remainder of the components during the automated process. After the board is manufactured as one assembly, the section is snapped apart from the remainder of the board, and the board and break-away section are mounted at the desired locations on the vehicle.

5 Claims, 2 Drawing Sheets

IGNITION CIRCUIT MODULE AND METHOD OF MANUFACTURE

BACKGROUND OF THE INVENTION

1.) Field of the Invention

The present invention relates generally to vehicles such as lawn and garden tractors, and, more specifically, to a circuit board arrangement for the ignition and other portions of the electrical system for such a vehicle.

2.) Related Art

As more safety interlock systems are added to lawn and garden vehicles, the ignition circuit complexity has increased. To determine the operational state of tractor subsystems such as the PTO (power take off), transmission and brakes, more sensors, switches, relays, and wiring circuits have been included. The additional components have typically brought with them an decrease in the reliability of the wiring system. The severe operating environment of the vehicles often causes degradation of the wiring terminals which results in increase voltage drops and the inability to engage solenoids.

Heretofore, additional relays stacked in stages were required to overcome the problems caused by voltage drops. Typically, a relay is added in an accessible area and a wiring harness is connected to the relay. Diodes are often added to the harness which increases manufacturing time and expense. Easy and neat assembly of the system is not possible. Testing the electrical system during manufacture, and diagnosis and repair of the system during the life of the vehicle have become increasingly difficult. Adding extra features to the electrical system such as time delays, bulb checks or the like can be troublesome.

BRIEF SUMMARY OF THE INVENTION

It is therefore an object of the present invention to provide an improved electrical system and method of manufacture of the system for a vehicle such as a lawn and garden tractor which overcome many or all of the problems discussed above. It is a further object to provide such a system and method which increase the reliability of the electrical system at manufacture and maintain higher reliability throughout the vehicle life.

It is another object to provide an improved electrical system and method of manufacture thereof for a lawn and garden vehicle having a safety interlock system. It is a further object to provide such a system and method which reduce voltage drops in the system and eliminate the need for a starter relay. It is still another object to provide such a system and method which facilitate testing of the circuits outside the vehicle during assembly and servicing of the vehicle, and which expedite installation of the system.

It is yet a further object of the invention to provide an improved circuit board and method of manufacture thereof for a vehicle such as a lawn and garden tractor. It is another object to provide such a board which eliminates wiring harness circuits and terminations, raises the initial reliability and maintains higher reliability through the life of the vehicle, and is compact and easy to manufacture and install. It is another object to provide such a board which simplifies and lowers the cost of the overall electrical system.

It is yet another object of the present invention to provide an improved circuit board and method of manufacture thereof for the electrical system on a vehicle such as a lawn and garden tractor. It is another object to provide such a board and method wherein most of the connections in the circuit board including the switch connections are accomplished by a single automated operation such as wave soldering and wherein portions of the printed circuit board may be remotely located from the remainder of the board after the board is manufactured.

In accordance with the above objects, a printed circuit board (PCB) is provided which directly mounts the switches and other electrical system components such as diodes, relays, and fuses. All the components, including the ignition switch and interlock relays, are directly soldered to the PCB using wave soldering techniques for good quality control and reduced voltage drops so that one or more of the relays, including the starter relay, may be eliminated. The entire interlock system is contained on the compact PCB so that the circuits can be tested outside the vehicle prior to assembly and later during servicing of the vehicle. The PCB allows use of a simpler wiring harness which is less expensive and easier to neatly install than at least most other previously available wiring harnesses. Wiring system costs are reduces, and additional electrically operated features such as time delays, bulb checks and PTO circuits may be added to the PCB with little difficulty. Less room, hardware and assembly time are required than with most previously available electrical systems.

Another feature of the invention includes providing the PCB with one or more "break-away" component sections (BACS) for locating a component of the system, such as a switch, remotely from the remainder of the PCB while permitting the entire PCB including the BACS to be manufactured as one assembly. Wiring leads on the PCB and/or switch are directly soldered to reduce voltage drops. The PCB is manufactured with a weakened break line so that the BACS can be simply snapped off of the remainder of the board to locate the component or components thereon at the desired location. If remote location of the BACS is unnecessary for a particular application, the entire PCB can be mounted at one location, preferably at the ignition switch location on the control console with the ignition switch providing all or a substantial portion of the support for the PCB. If space or other limitations prevent mounting the entire board at the switch location, wires can be soldered directly between the BACS supporting the switch and the remainder of the PCB during PCB manufacture. At assembly, the BACS with the switch is snapped from the remainder of the PCB and remotely located with the preconnected wires providing good electrical connections between the BACS and the remainder of the PCB. The direct connections reduce voltage drops and facilitate the elimination of relays such as the starter relay heretofore necessary in most similar systems.

These and other objects, features and advantages of the present invention will become apparent to one skilled in the art upon reading the following detailed description in view of the drawings.

DETAILED DESCRIPTION OF THE DRAWINGS

Figure 1:
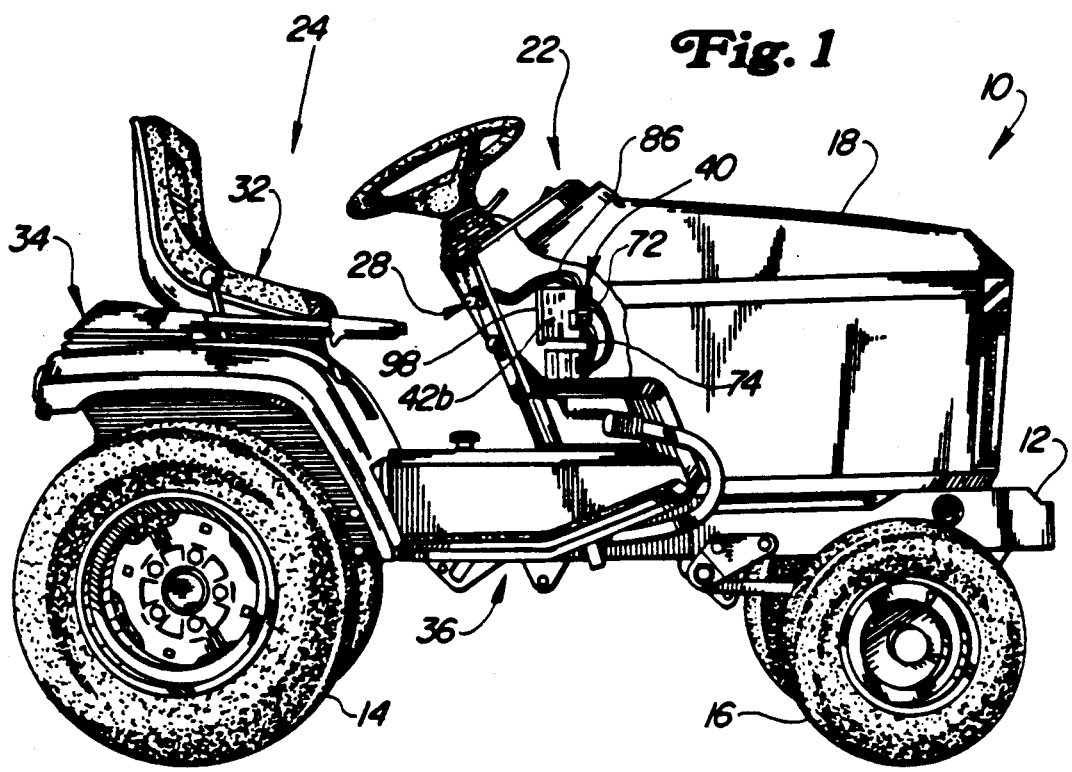
FIG. 1 is a side view of a vehicle with one embodiment of the ignition circuit of the present invention attached thereto.

Referring now to FIG. 1, therein is shown a vehicle 10, such as a lawn and garden tractor, having a frame 12 supported for movement over the ground by wheels 14 and 16, and driven by a conventional engine mounted on the frame 12 under a hood section 18. A console or instrument panel 22 at the operator's station 24 includes an ignition switch 28 as well as conventional electrically operated indicators and warning lights (not shown) responsive to conditions on the vehicle 10. Switches are provided at locations 32, 34 and 36 to provide operator presence, parking brake and brake pedal indications, respectively. A PTO engagement switch 38 is also mounted on the console 22. Examples of the above-described structure can be found on the commercially available John Deere Model 180 Lawn Tractor.

An ignition circuit module indicated generally at 40 is assembled on a single printed circuit board (PCB) 42 (FIG. 2a) having two sections 42a and 42b. The PCB 42 supports electronic components such as ignition and PTO relays 44 and 46, resistors 48, fuses 50 and diodes 52.

The ignition switch 28 includes a mounting bracket 56 riveted to the section 42a. The ignition switch terminals project downwardly and are soldered to the PCB 42 in an automated soldering process (such as conventional wave soldering) at the same time the components 44-52 are soldered to the board. A threaded mounting portion 58 including an anti-rotation flat 62 projects outwardly from the board 42 and is received in a mating hole in the console 22. A securing nut 64 is threaded onto the portion 58 to secure the switch 28 in position on the console 22. As best seen in FIG. 3, the entire board 42 may be supported substantially entirely from ignition switch 28 if it is determined that there is sufficient access space at the console 22. Alternatively, as will be discussed in detail below, the section 42a may be separated from the section 42b (FIGS. 1 and 2b) so that only the BACS portion of the PCB 42 is supported from the switch 28 on the console 22 if it is determined that there is insufficient space adjacent the console for good access.

Wiring harnesses 72 and 74 are connected between the circuit board 42 and various elements including interlock switches and ignition components and the starter on the vehicle 10. As shown in the embodiment of FIGS. 3 & 4, connectors 76 and 78 are soldered to the board 42 and receive mating connectors on the board ends of the harnesses 72 and 74. However, to reduce voltage drops at the harness connections, the harness ends preferably are soldered directly to the board 42 (see FIGS. 2a & 2b), during the automated wave soldering process, at the same time the circuit board components are soldered. The ends of the wiring harnesses 72 and 74 may also be soldered directly to the sensors (such as the seat, PTO and transmission switches) to further reduce voltage drops and thereby reduce the number of relays necessary for a given circuit configuration.

The reduced voltage drops resulting from the above-described direct wiring arrangement facilitates elimination of a starter relay normally associated with the ignition circuit. Instead, the ignition switch may be connected directly through the interlock circuit on the PCB 42 to the starter on the vehicle.

Figures 2A, 2B:
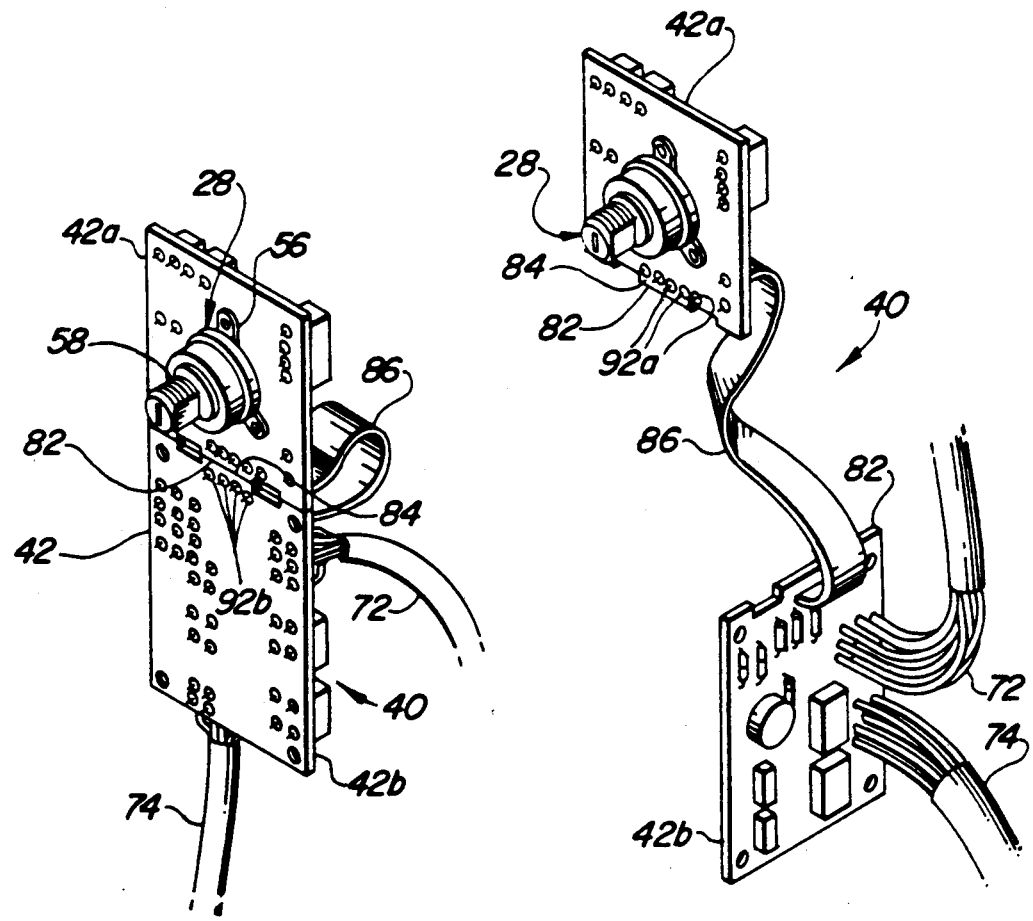
FIG. 2a perspective view of a printed circuit board (PCB) constructed in accordance with the teachings of the present invention and showing the wiring harnesses and board interconnecting wires for the two-section PCB prior to the board sections being separated.
FIG. 2b is a view of the board of FIG. 2a with a break-away component section (BACS) connected by wires to and remotely located with respect to the remainder of the PCB.
Figure 3:
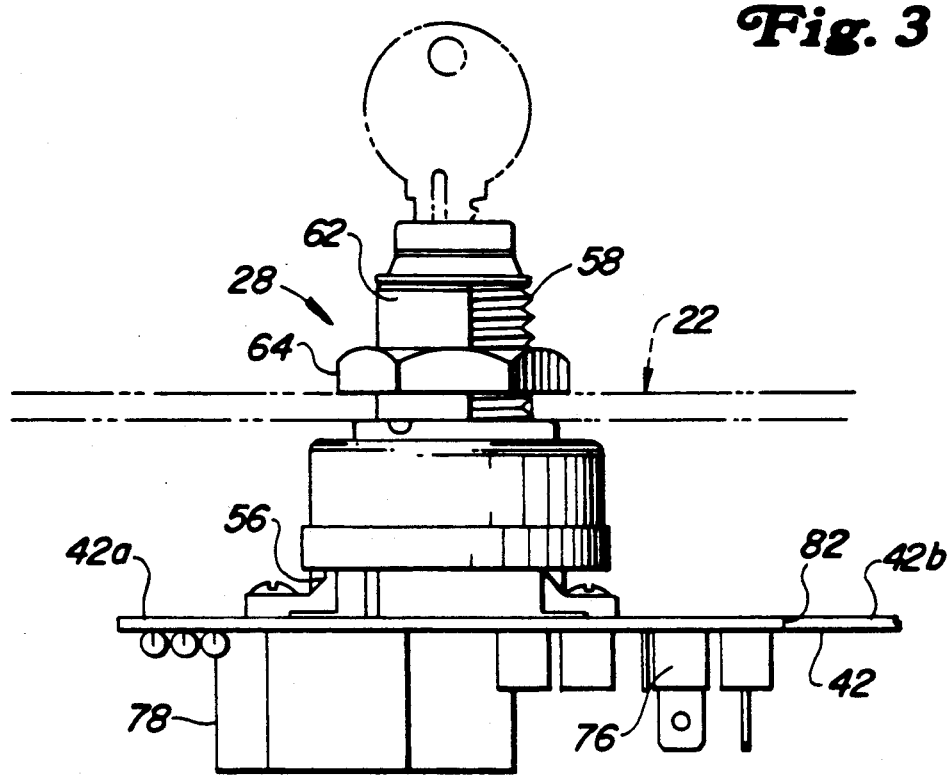
FIG. 3 is a top view of the PCB supported entirely at the ignition switch location on the vehicle.
Figure 4:
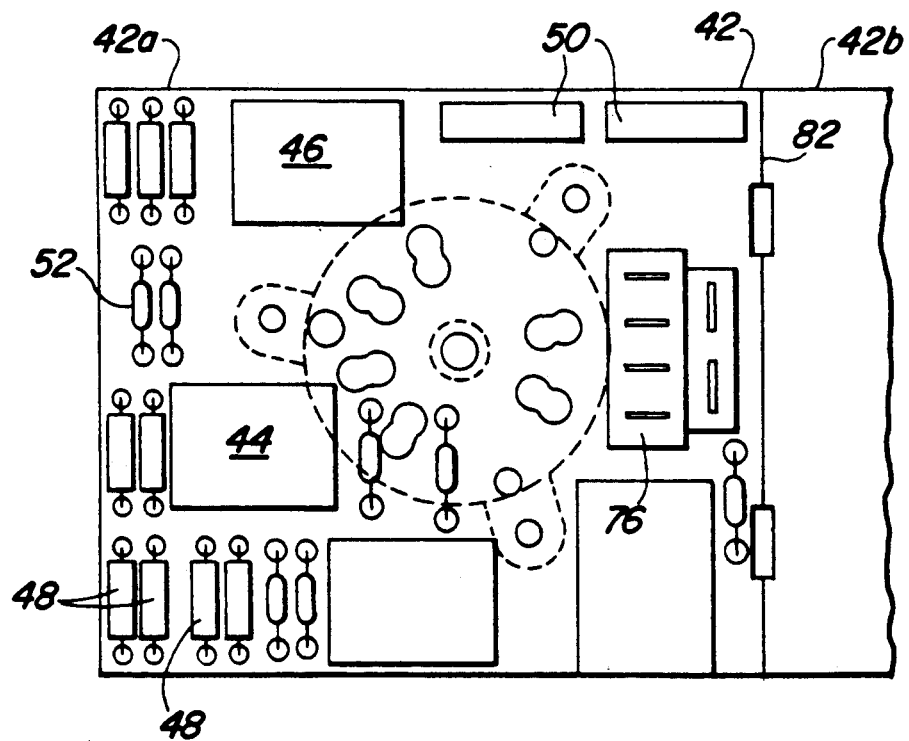
FIG. 4 is a view of the component side of the board of FIG. 3.

As best seen in FIGS. 2-4, the PCB 42 is scored or otherwise weakened at a location line 82 so that the sections 42a and 42b may be snapped apart when it is necessary to mount the switch 28 on the section 42a at a location remote from the section 42b (such as shown in FIG. 1 wherein access space is determined too be to limited for conveniently supporting the entire board 42 rom the console). The pattern of the copper conductor on the PCB 42 includes narrow conduction paths 84 extending across the line 82 and electrically connecting the sections 42a and 42b. When the PCB is snapped into two separate sections 42a and 42b, the copper conduction paths are broken. To provide the necessary electrical interconnection between the board sections 42a and 42b, the ends of a multiconductor ribbon wire 86 are wave-soldered in solder locations 92a and 92b in the conduction paths on the opposite sides of the line 82. The ribbon wire 86 is soldered to the unitary board 42 (FIG. 2a) at the same time as the board components 44-52 and the ignition switch 28 are soldered. Therefore, the entire PCB 42 is initially fabricated as a single unit, and thereafter the sections 42a and 42b are snapped apart with the ribbon conductor 86 that makes the board interconnections already soldered in place. The direct wiring arrangement, including the soldered interconnection 86, facilitates elimination of a starter relay normally associated with the ignition circuit.

As shown in FIGS. 1, the switch section 42a is supported from the console 22 by the switch 28. The remaining board section 42b is mounted on the vehicle frame 12 by a bracket 98 for convenient access during assembly, servicing and repair of the vehicle. Prior to installation in the vehicle 10 as well as during servicing of the vehicle, the vehicle system circuits may be checked outside of the vehicle. Additional components such as time delay circuits, bulb checks or PTO brake coil circuits can be easily added to the section 42b.

Having described the preferred embodiment, it will become apparent that various modifications can be made without departing from the scope of the invention as defined in the accompanying claims.

What is claimed is:

1. A method for manufacturing an ignition system for a lawn and garden vehicle having an operator's station, a condition-responsive device for sensing at least one vehicle operational state, and at least one condition-responsive circuit operably connected to the condition-responsive device and responsive to the operation state sensed by the device, the method comprising:

fabricating a circuit board as a single assembly including providing a single circuit board having a break-away section thereon and soldering condition-responsive circuit components to the board in an automated soldering process;

connecting a control component to the break-away section or the board; and attaching the control component with the break-away section of the board connected thereto to the operator's station, the step of attaching including:

(a) determining whether or not there is sufficient space at the operator station for accessibly mounting the entire circuit board as a single assembly; and (b) mounting the entire circuit board as a single assembly at the operator's station if the determination indicates there is sufficient space, or, alternatively, separating the break-away section with the control component connected thereto and remotely locating the remainder of the board from the break-away section if the determination indicates there is insufficient space.

2. The invention as set forth in claim 1 including the step of soldering the control component to the break-away section and a wiring harness to the board simultaneously with the soldering of the components to the board.

3. The invention as set forth in claim 1 further including the step of soldering a flexible electrical connection between the break-away section and the remainder of the board simultaneously with the soldering of the components to the board for electrically connecting the control component to the remainder of the board when the break-away section and the remainder of the board are remotely located relative to each other.

4. The invention as set forth in claim 1 wherein the step of connecting a control component includes connecting an ignition switch to the break-away section, and supporting the break-away section from the operator's station via the switch.

5. The invention as set forth in claim 4 wherein the tractor includes a starter, and further including the step of soldering the ignition switch directly to the board to connect the ignition switch through the interlock circuit on the board to the starter independently of a starter relay.

* * * * *